United States Patent
Chuang

(10) Patent No.: US 7,859,843 B2
(45) Date of Patent: Dec. 28, 2010

(54) HEAT DISSIPATION STRUCTURE

(75) Inventor: Ping-Yang Chuang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 28 days.

(21) Appl. No.: 12/436,763

(22) Filed: May 6, 2009

(65) Prior Publication Data

US 2010/0232108 A1  Sep. 16, 2010

(30) Foreign Application Priority Data

Mar. 10, 2009  (CN) .................. 2009 1 0300786

(51) Int. Cl.
*H05K 7/20* (2006.01)

(52) U.S. Cl. .............. 361/697; 361/679.47; 361/679.48; 361/679.49; 361/695; 361/704; 165/80.3; 165/121; 165/122

(58) Field of Classification Search . 361/679.46–679.5, 361/679.54, 690–697, 702–712, 715, 729, 361/722–727, 736, 752; 257/713, 718, 719, 257/722, 723; 174/15.1, 16.3, 252; 454/184; 165/80.3, 104.21, 104.33, 121–126, 185; 312/223.2, 223.3, 236, 265
See application file for complete search history.

(56) References Cited

U.S. PATENT DOCUMENTS

| | | | | |
|---|---|---|---|---|
| 5,019,880 A * | 5/1991 | Higgins, III | ................ | 257/714 |
| 5,132,780 A * | 7/1992 | Higgins, III | ................ | 257/722 |
| 5,494,098 A * | 2/1996 | Morosas | ................ | 165/121 |
| 5,504,650 A * | 4/1996 | Katsui et al. | ................ | 361/697 |
| 5,650,912 A * | 7/1997 | Katsui et al. | ................ | 361/697 |
| 5,898,568 A * | 4/1999 | Cheng | ................ | 361/695 |
| 6,104,607 A * | 8/2000 | Behl | ................ | 361/679.49 |
| 6,118,658 A * | 9/2000 | Nakase | ................ | 361/697 |
| 6,137,680 A * | 10/2000 | Kodaira et al. | ................ | 361/697 |
| 6,233,149 B1 * | 5/2001 | Bailey et al. | ................ | 361/704 |
| 6,570,760 B1 * | 5/2003 | Wang | ................ | 361/679.47 |
| 6,659,169 B1 * | 12/2003 | Lopatinsky et al. | ................ | 165/121 |
| 6,684,942 B2 * | 2/2004 | Song et al. | ................ | 165/122 |
| 6,700,781 B2 * | 3/2004 | Chia-Kuan et al. | ................ | 361/697 |
| 6,724,624 B1 * | 4/2004 | Dodson | ................ | 361/695 |
| 6,822,856 B2 * | 11/2004 | Fujiwara | ................ | 361/679.48 |
| 6,885,555 B2 * | 4/2005 | Greco | ................ | 361/695 |
| 7,165,604 B2 * | 1/2007 | Huang | ................ | 165/121 |
| 7,385,816 B1 * | 6/2008 | Foster et al. | ................ | 361/697 |
| 7,391,612 B2 * | 6/2008 | Foster et al. | ................ | 361/697 |
| 7,532,474 B2 * | 5/2009 | Xue et al. | ................ | 361/704 |
| 7,554,805 B2 * | 6/2009 | Liu et al. | ................ | 361/695 |

\* cited by examiner

*Primary Examiner*—Michael V Datskovskiy
(74) *Attorney, Agent, or Firm*—Zhigang Ma

(57) ABSTRACT

A heat dissipation structure includes an electronic device, and a cooling device mounted to the electronic device. The electronic device includes a housing, and a heat generating element mounted in the housing. The housing defines an opening. The cooling device comprises a shell abutting against the heat generating element through the opening, a number of fins extending from the shell, a fan mounted to the shell, an air intake, and an air outlet. The air intake and the air outlet are located outside the housing.

17 Claims, 8 Drawing Sheets

HEAT DISSIPATION STRUCTURE

BACKGROUND

1. Technical Field

The disclosure relates to a heat dissipation structure for electronic devices.

2. Description of Related Art

Nowadays, the trend for electronic devices, especially computers, is miniaturization, which leads to cooling problems. For example, when cooling a heat generating element, such as a central processing unit, of a notebook computer or a mini desktop computer, two ways are usually used. One way is to employ a traditional fan and heat sink for dissipating heat, which is low-cost but takes up a lot of space. The other way is to employ heat pipes, which are sufficient for cooling, but too expensive.

DETAILED DESCRIPTION

Figure 1:
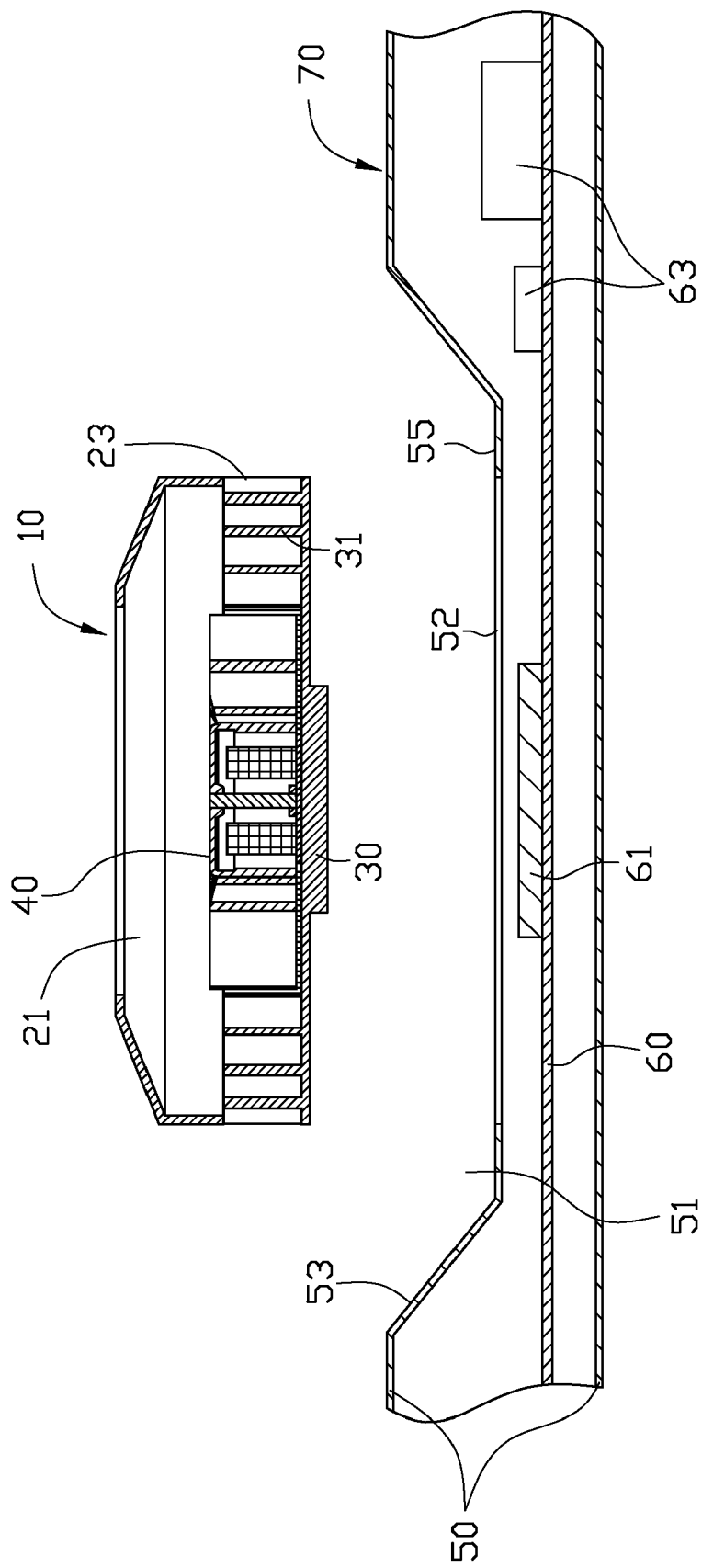
FIG. 1 is a cross-sectional, exploded view of a first exemplary embodiment of a heat dissipation structure, the heat dissipation structure including a cooling device.
Figure 2:
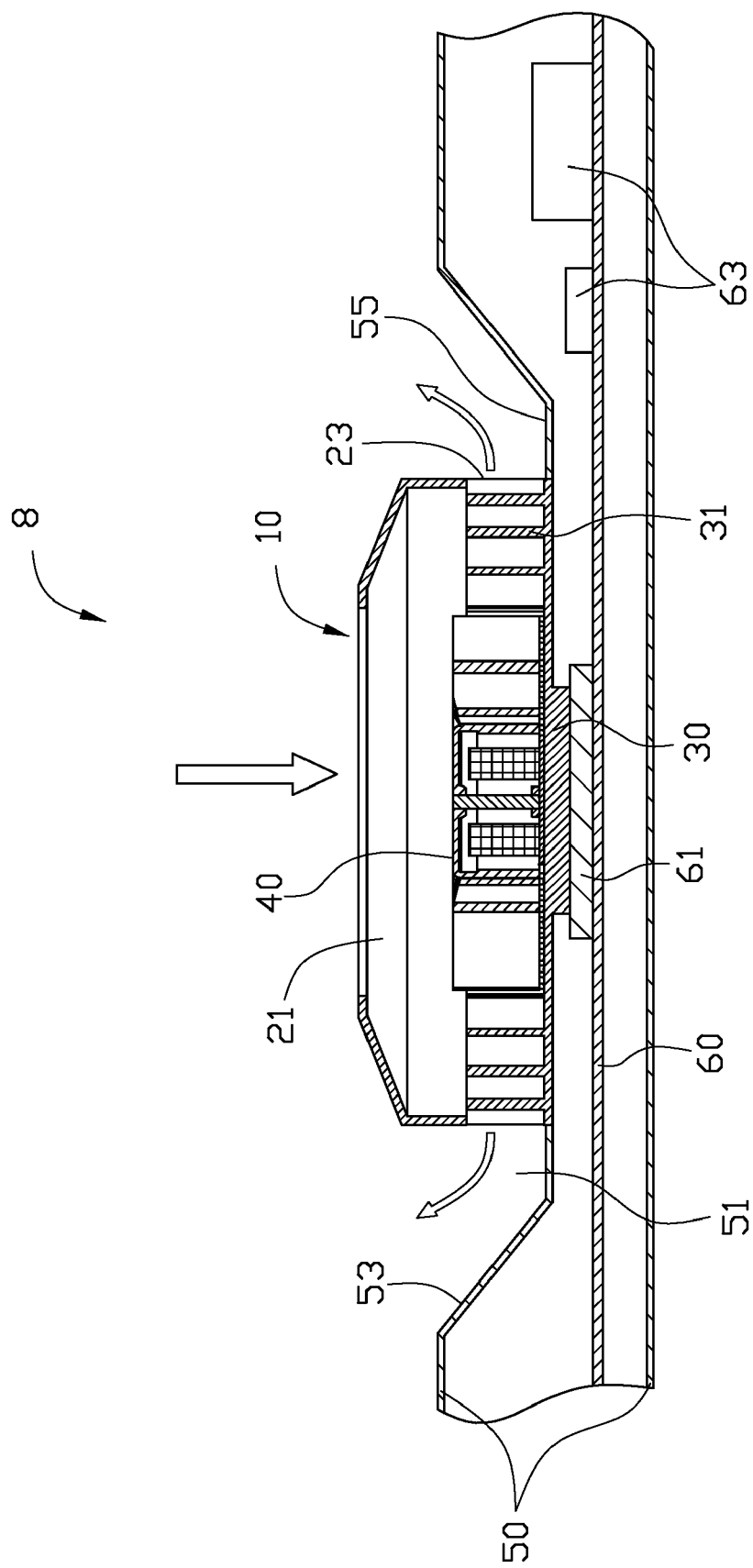
FIG. 2 is an assembled view of FIG. 1.
Figure 3:
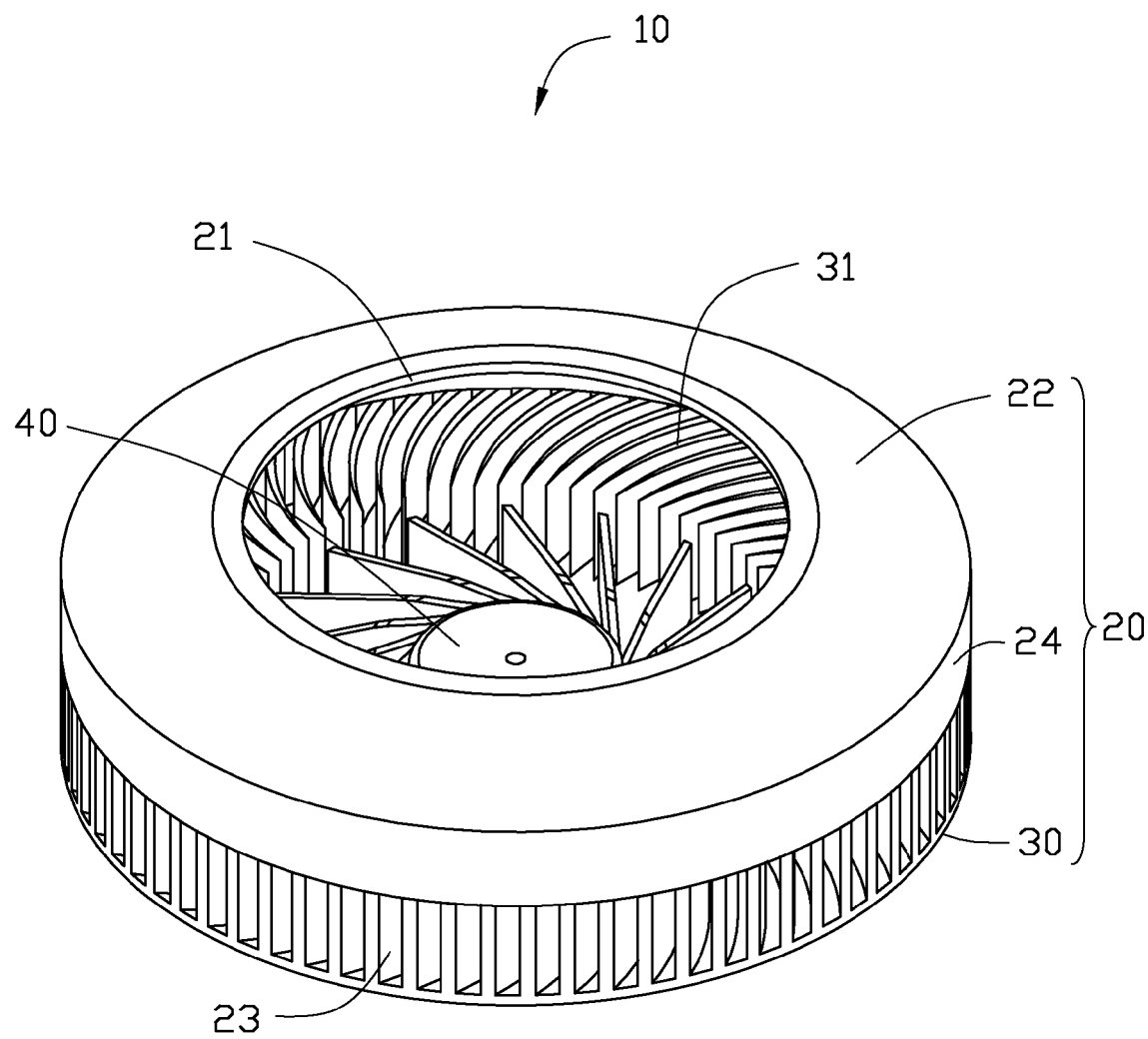
FIG. 3 is an isometric view of the cooling device of FIG. 1.

Referring to FIGS. 1 to 3, a heat dissipation structure 8 according to a first embodiment of the present disclosure includes an electronic device 70 and a cooling device 10.

The electronic device 70 includes a housing 50 and a printed circuit board (PCB) 60 mounted in the housing 50. A depressed portion 51 is formed in the housing 50. A sidewall 53 of the depressed portion 51 is angled relative to a bottom wall 55 of the depressed portion 51. An opening 52, matching the cooling device 10, is defined in a center of the bottom wall 55 of the depressed portion 51 for mounting the cooling device 10. The PCB 60 includes a first heat generating element 61 and a plurality of second heat generating elements 63. In one embodiment, the PCB 60 is a motherboard of a computer, and the first heat generating element 61 is a central processing unit (CPU).

The cooling device 10 includes a generally short cylinder-shaped shell 20. The shell 20 includes a top board 22, a bottom board 30, and an annular side board 24 perpendicularly connected between the top board 22 and the bottom board 30. A hole is defined in a center of the top board 22, forming an air intake 21. A plurality of slots is spacedly defined in the side board 24, adjacent to the bottom board 30 to form an air outlet 23. The bottom board 30 is used for touching with the first heat generating element 61 to collect heat generated by the heat generating element 61. A plurality of fins 31 extends perpendicularly from the inner side of the bottom board 30 in the shell 20, and radially extends from a center of the shell 20 to the air outlet 23. An eddy current fan 40 is mounted in the shell 20, encircled by the plurality of fins 31.

In assembly, the cooling device 10 is mounted to the electronic device 70 via the opening 52 of the depressed portion 51 of the housing 50. The bottom board 30 of the cooling device 10 abuts against the first heat generating element 61 in the housing 50. The air intake 21 and the air outlet 23 of the cooling device 10 are located outside the housing 50.

In use, the bottom board 30 of the cooling device 10 collects heat generating from the first heat generating element 61 and transfers the heat to the plurality of fins 31. When the fan 40 works, it draws cool air from outside the housing 50 into the cooling device 10 through the air intake 21. The air then exits from the cooling device 10 through the air outlet 23, taking heat of the plurality of fins 31 directly to the outside of the housing 50 of the electronic device 70.

It is noted that the depressed portion 51 of the housing 50 is designed for reducing overall thickness and beautifying the external appearance of the electronic device 70 mounting the cooling device 10. The angled sidewall 53 can facilitate guiding the air away that is exhausted by the cooling device 10.

In other embodiments, a blade fan may be used to replace the eddy current fan 40.

Figure 4:
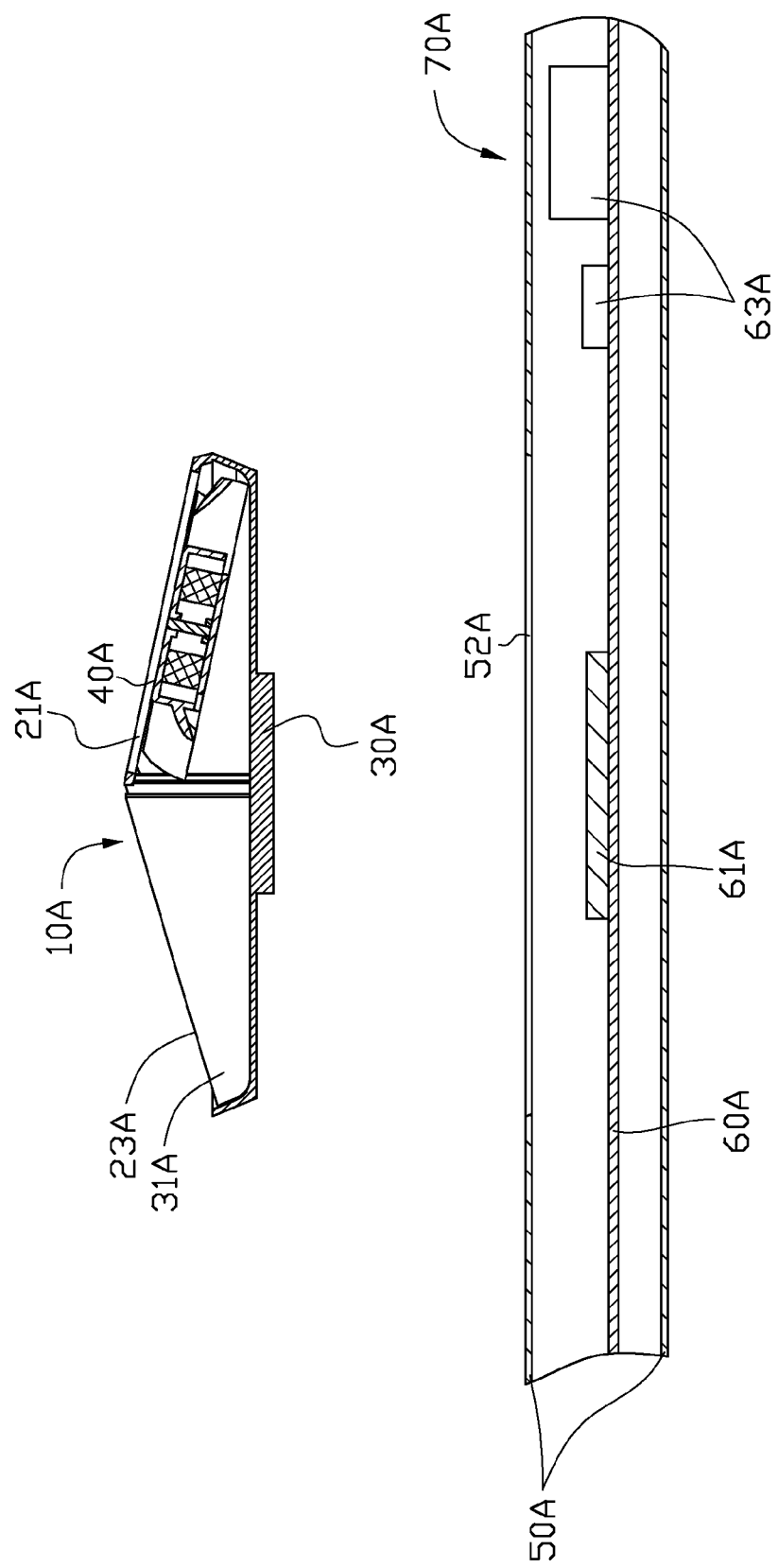
FIG. 4 is a cross-sectional, exploded view of a second exemplary embodiment of a heat dissipation structure, the heat dissipation structure including a cooling device.
Figure 5:
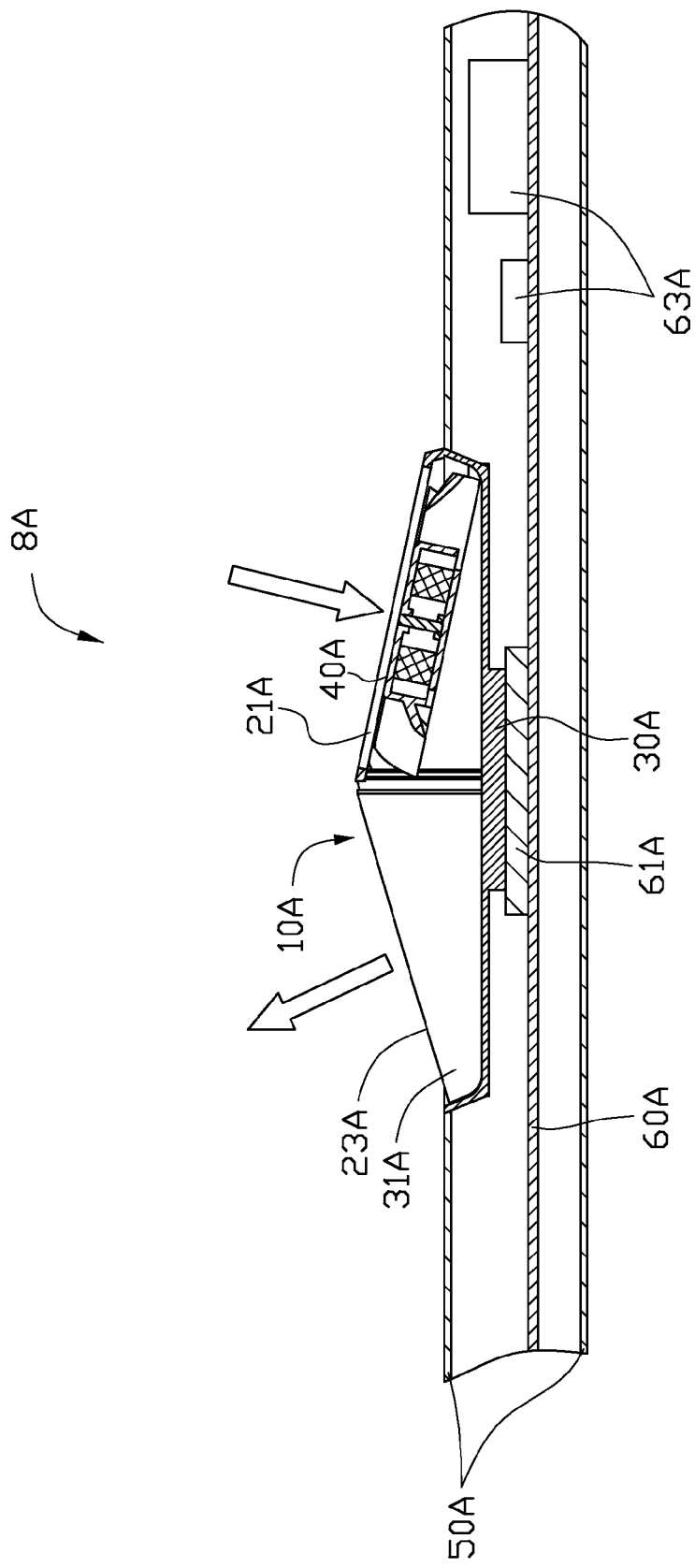
FIG. 5 is an assembled view of FIG. 4.
Figure 6:
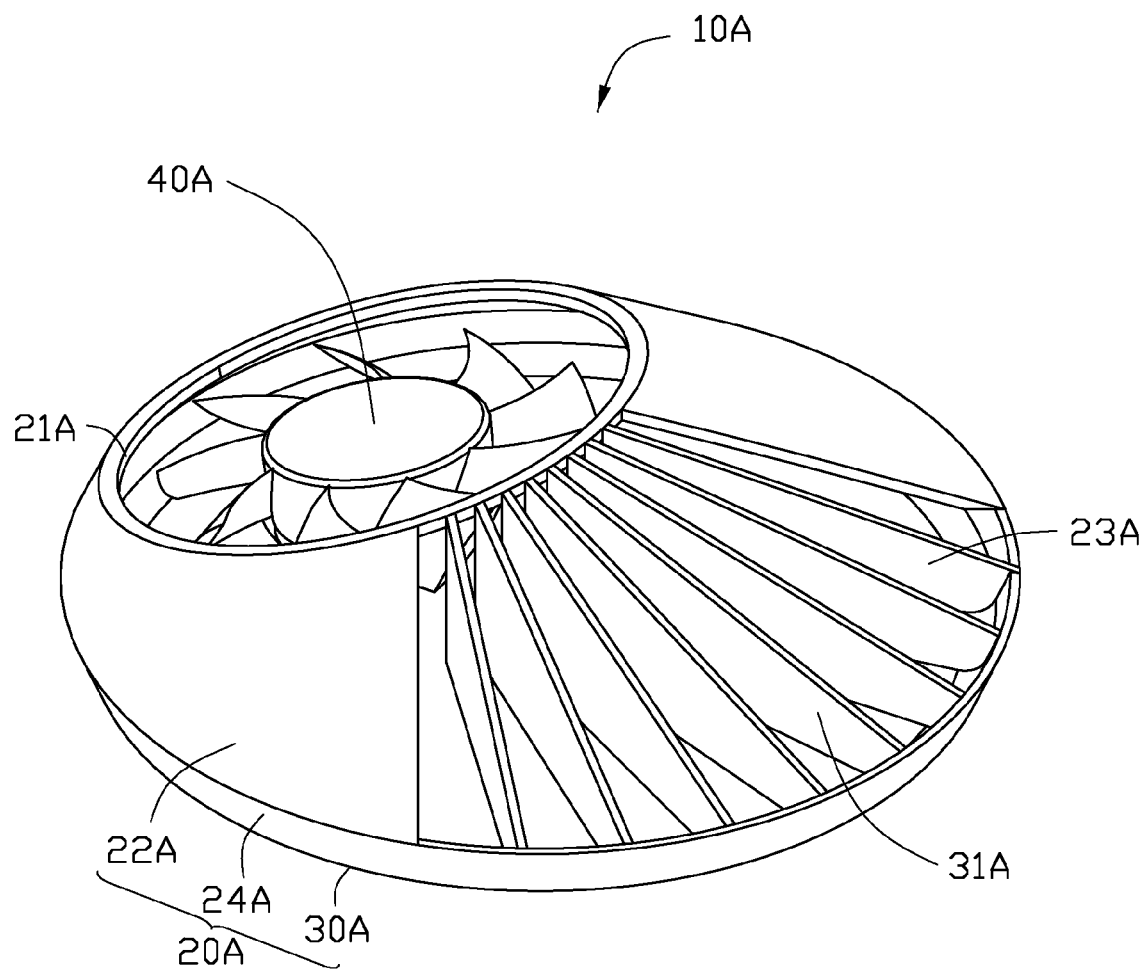
FIG. 6 is an isometric view of the cooling device of FIG. 4.

Referring to FIGS. 4 to 6, a heat dissipation structure 8A according to a second embodiment of the present disclosure includes an electronic device 70A and a cooling device 10A.

The electronic device 70A includes a housing 50A and a printed circuit board (PCB) 60A mounted in the housing 50A. An opening 52A, matching the cooling device 10A, is defined in the housing 50A for mounting the cooling device 10A. The PCB 60A includes a first heat generating element 61A and a plurality of second heat generating elements 63A. In one embodiment, the PCB 60A is a motherboard of a computer, and the first heat generating element 61A is a central processing unit (CPU).

The cooling device 10A includes a shell 20A. The shell 20A includes a generally tapered top board 22A, a bottom board 30A, and an annular sideboard 24A connected between the top board 22A and the bottom board 30A. A hole is defined in a first side of the top board 22A, forming an air intake 21A. A fan-shaped hole is defined in a second side of the top board 22A opposite to the first side, forming an air outlet 23A. The bottom board 30A is used for touching with the first heat generating element 61A to collect heat generated by the heat generating element 61A. A plurality of fins 31A in a fan-like arrangement extends perpendicularly from an inner side of the bottom board 30A to the air outlet 23A. A blade fan 40A is mounted in the air intake 21A of the shell 20A.

In assembly, the cooling device 10A is mounted to the electronic device 70A via the opening 52A of the housing 50A. The bottom board 30A of the cooling device 10A abuts against the first heat generating element 61A in the housing 50A. The air intake 21A and the air outlet 23A of the cooling device 10A are located outside the housing 50A.

In use, the bottom board 30A of the cooling device 10A collects heat from the first heat generating element 61A and transfers the heat to the plurality of fins 31A. When the fan 40A works, it draws cool air from outside the housing 50A into the cooling device 10A through the air intake 21A, and then the air exits from the cooling device 10A through the air outlet 23A, taking heat of the plurality of fins 31A, directly to the outside of the housing 50A of the electronic device 70A.

In other embodiments, an eddy current fan may be used to replace the blade fan 40A.

According to the first and second embodiments, a direct thermal through technology (DTT) is used in the heat dissipation structures 8 and 8A. In other words, because of the use of the DTT, the cool air does not merely pass through the inside of the housing 50 or 50A, but directly enters into the cooling device 10 or 10A from the outside of the housing 50 or 50A, passes through the cooling device 10 or 10A, and then directly exits to the outside of the housing 50 or 50A. The air intake 21 or 21A and the corresponding air outlet 23 or 23A of the corresponding cooling device 10 or 10A of the corresponding heat dissipation structure 8 or 8A are both located outside the corresponding housing 50 or 50A, thereby avoiding heated air to tarry in the corresponding electronic device 70 or 70A so as to improve heat radiating efficiency.

Figure 7:
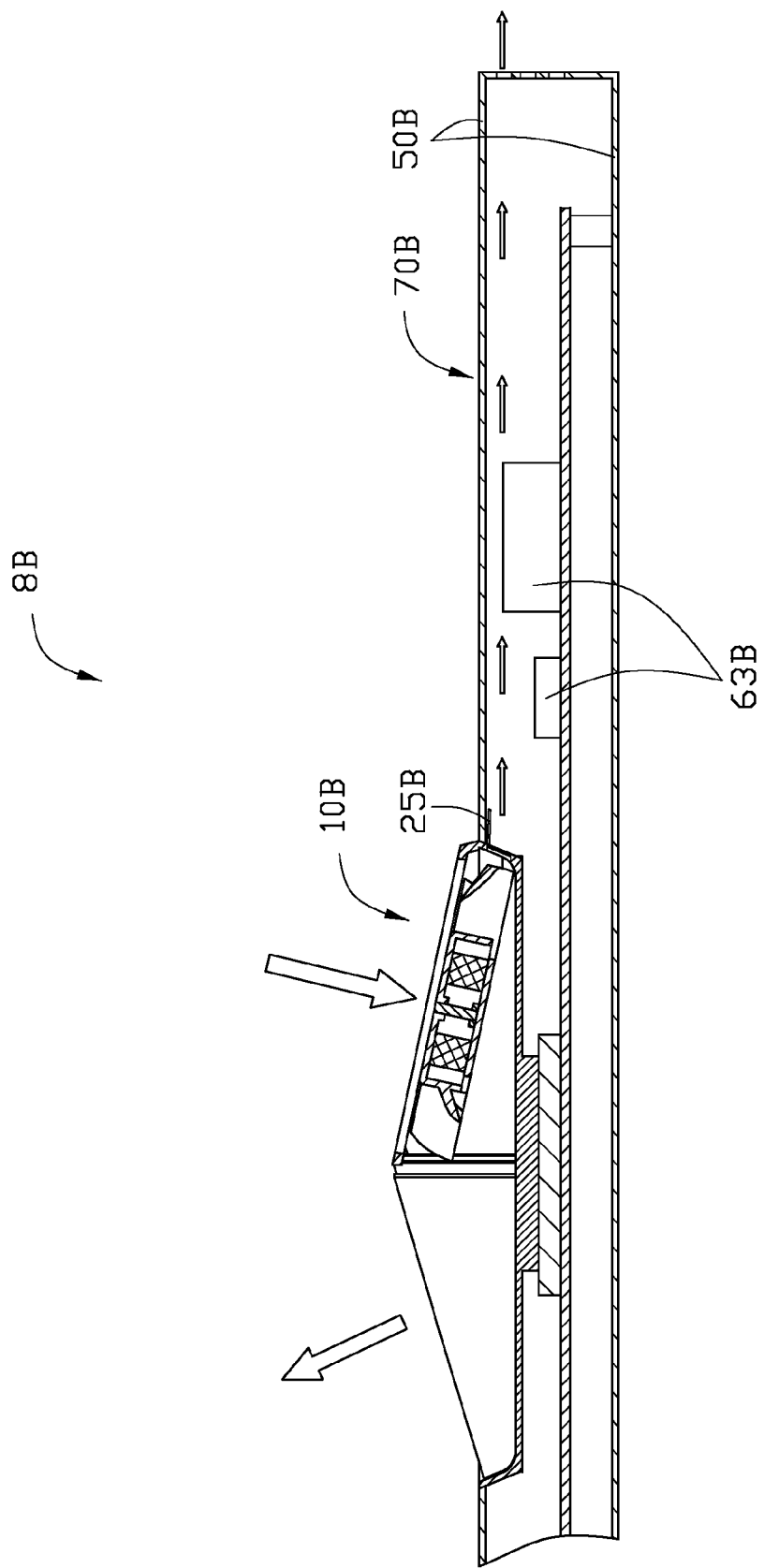
FIG. 7 is a cross-sectional, assembled view of a third exemplary embodiment of a heat dissipation structure, the heat dissipation structure including a cooling device.
Figure 8:
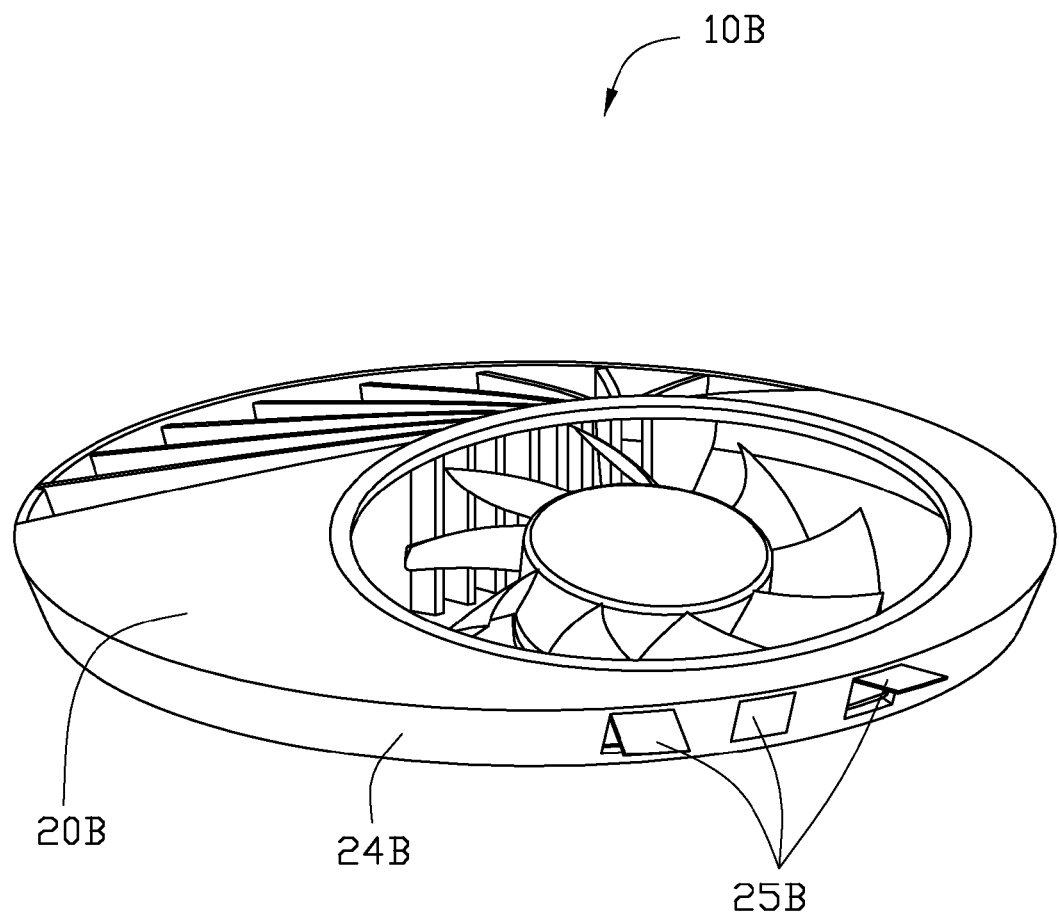
FIG. 8 is an isometric view of the cooling device of FIG. 7.

Referring to FIGS. 7 and 8, a heat dissipation structure 8B according to a third embodiment of the present disclosure is shown, differing from the second embodiment in FIGS. 4 to 6 only in that a plurality of valves 25B is employed. The plurality of valves 25B is formed on a side board 24B of a shell 20B of a cooling device 10B, inside a housing 50B of an electronic device 70B. Each valve 25B can be controlled to open or close, and an opening degree of the valve 25B can also be adjusted, allowing superfluous cool air entering into the housing 50B to cool one or more second heat generating elements 63B.

In the present disclosure, DDT is adopted for the heat dissipation structures 8, 8A, and 8B. A rate of heat exchange of the heat dissipation structure 8, 8A or 8B of more than 50% can be provided at low cost. The heat dissipation structures 8, 8A, and 8B can be applied to many electronic devices, especially tiny or slim systems, such as notebook computers, mini desktop computers, or liquid crystal displays.

It is to be understood, however, that even though numerous characteristics and advantages of the disclosure have been set forth in the foregoing description, together with details of the structure and function of the invention, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A heat dissipation structure comprising:
    an electronic device comprising a housing, and a printed circuit board mounted in the housing, wherein the printed circuit board comprises a heat generating element, the housing defines an opening;
    a cooling device mounted to the housing, wherein the cooling device comprises a shell abutting against the heat generating element through the opening, a plurality of fins extending from the shell, a fan mounted to the shell, an air intake, and an air outlet, wherein the air intake and the air outlet are located outside the housing;
    wherein the shell comprises a top board, a bottom board opposite to the top board, and a side board connected between the top board and the bottom board, wherein the bottom board abuts against the heat generating element; and
    the heat dissipation structure further comprising at least one valve defined in the side board, wherein the at least one valve is located inside the housing.

2. The heat dissipation structure of claim 1, wherein the air intake is defined in the top board, the air outlet is defined in the side board.

3. The heat dissipation structure of claim 2, wherein the shell is generally short cylinder-shaped, the air intake is defined in a centre of the top board, the air outlet is defined circularly in the side board.

4. The heat dissipation structure of claim 3, wherein the fan is received in the shell under the air intake, the plurality of fins extends perpendicularly from the bottom board in the shell and encircling the fan.

5. The heat dissipation structure of claim 4, wherein the fan is an eddy current fan.

6. The heat dissipation structure of claim 1, wherein the air intake and the air outlet are defined in the top board.

7. The heat dissipation structure of claim 6, wherein the top board is generally tapered, the air intake and the air outlet are oppositely defined in the top board.

8. The heat dissipation structure of claim 7, wherein the fan is received in the shell under the air intake, the plurality of fins extends perpendicularly from the bottom board to the air outlet.

9. A heat dissipation structure comprising:
    an electronic device comprising a housing, and a heat generating element mounted in the housing, wherein the housing defines an opening; and
    a cooling device to cool the heat generating element, wherein the cooling device comprises a shell absorbing heat generated from the heat generating element through the opening, a fan mounted to the shell, an air intake, and an air outlet, wherein the air intake and the air outlet are located outside the housing;
    wherein the shell comprises a generally tapered top board, a bottom board, and an annular sideboard connected between the top board and the bottom board.

10. A heat dissipation structure comprising:
    an electronic device comprising a housing, and a heat generating element mounted in the housing; and
    a cooling device mounted to the electronic device, wherein the cooling device comprises a shell abutting against the heat generating element, a plurality of fins extending from the shell, a fan mounted to the shell, an air intake, and an air outlet, wherein the air intake and the air outlet are located outside the housing;
    wherein when the fan is operated, cool air directly enters into the cooling device through the air intake, and after taking heat from the fins, directly exits to the outside of the housing through the air outlet;
    wherein a depressed portion is formed in the housing, an opening is defined in a bottom wall of the depressed portion for matching the cooling device, to allow the shell to abut against the heat generating element.

11. The heat dissipation structure of claim 10, wherein a sidewall of the depressed portion is angled relative to the bottom wall.

12. The heat dissipation structure of claim 10, wherein the shell is generally short cylinder-shaped, and comprises a top board, a bottom board opposite to the top board, and a side board connected between the top board and the bottom board.

13. The heat dissipation structure of claim 12, wherein the air intake is defined in a centre of the top board, and the air outlet is defined in the side board.

14. The heat dissipation structure of claim 13, wherein the fan is received in the shell under the air intake, the plurality of fins extends perpendicularly from the bottom board in the shell and radially extends from encircling the fan to the air outlet.

15. The heat dissipation structure of claim 9, wherein the fan is mounted in the air intake.

16. The heat dissipation structure of claim 9, wherein the air intake and the air outlet are oppositely defined in the top board.

17. The heat dissipation structure of claim 9, wherein a plurality of fins extends from an inner side of the bottom board to the air outlet.

* * * * *